(12) United States Patent
Lin et al.

(10) Patent No.: US 11,018,106 B2
(45) Date of Patent: May 25, 2021

(54) SEMICONDUCTOR DEVICE INCLUDING SOLDER BRACING MATERIAL WITH A ROUGH SURFACE, AND MANUFACTURING METHOD THEREOF

(71) Applicant: TAIWAN SEMICONDUCTOR MANUFACTURING COMPANY LTD., Hsinchu (TW)

(72) Inventors: Jing-Cheng Lin, Hsinchu County (TW); Feng-Cheng Hsu, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/013,914

(22) Filed: Jun. 20, 2018

(65) Prior Publication Data

US 2018/0301431 A1 Oct. 18, 2018

Related U.S. Application Data

(62) Division of application No. 14/140,853, filed on Dec. 26, 2013, now Pat. No. 10,020,275.

(51) Int. Cl.
*H01L 21/66* (2006.01)
*H01L 23/00* (2006.01)
*H01L 23/31* (2006.01)

(52) U.S. Cl.
CPC .............. *H01L 24/14* (2013.01); *H01L 22/12* (2013.01); *H01L 23/3171* (2013.01);
(Continued)

(58) Field of Classification Search
CPC ......... H01L 24/14; H01L 24/11; H01L 22/12; H01L 24/17; H01L 2224/101125; H01L 2224/10126
(Continued)

(56) References Cited

U.S. PATENT DOCUMENTS 7,407,833 B2 * 8/2008 Wu ..................... H01L 21/4853
257/737
7,611,040 B2 * 11/2009 Kitae .................. H01L 21/4853
228/180.22

(Continued)

OTHER PUBLICATIONS

Office Action and Search Report dated Oct. 2, 2019 issued by Deutsches Patent- und Markenamt (DPMA) for counterpart application No. 102014118931.0.

*Primary Examiner* — Robert T Huber
(74) *Attorney, Agent, or Firm* — WPAT, P.C., Intellectual Property Attorneys; Anthony King

(57) ABSTRACT

A semiconductor device includes a first substrate including a plurality of first pads disposed on a first surface of the first substrate, a second substrate including a plurality of second pads disposed on a second surface of the substrate, a plurality of conductive bumps bonded the plurality of first pads with the plurality of second pads correspondingly, a solder bracing material disposed on the first surface and surrounded the plurality of conductive bumps, an underfill material surrounded the plurality of conductive bumps and disposed between the solder bracing material and the second surface, and a rough interface between the solder bracing material and the underfill material. The rough interface includes a plurality of protruded portions and a plurality of recessed portions.

20 Claims, 18 Drawing Sheets

(52) U.S. Cl.
CPC .............. *H01L 24/11* (2013.01); *H01L 24/17* (2013.01); *H01L 24/05* (2013.01); *H01L 24/16* (2013.01); *H01L 24/32* (2013.01); *H01L 24/73* (2013.01); *H01L 24/92* (2013.01); *H01L 2224/0401* (2013.01); *H01L 2224/05572* (2013.01); *H01L 2224/05624* (2013.01); *H01L 2224/05639* (2013.01); *H01L 2224/05644* (2013.01); *H01L 2224/05655* (2013.01); *H01L 2224/05684* (2013.01); *H01L 2224/10125* (2013.01); *H01L 2224/10126* (2013.01); *H01L 2224/11019* (2013.01); *H01L 2224/1132* (2013.01); *H01L 2224/11462* (2013.01); *H01L 2224/131* (2013.01); *H01L 2224/13022* (2013.01); *H01L 2224/13111* (2013.01); *H01L 2224/13116* (2013.01); *H01L 2224/13118* (2013.01); *H01L 2224/13124* (2013.01); *H01L 2224/13144* (2013.01); *H01L 2224/13147* (2013.01); *H01L 2224/16225* (2013.01); *H01L 2224/16238* (2013.01); *H01L 2224/32225* (2013.01); *H01L 2224/73204* (2013.01); *H01L 2224/81191* (2013.01); *H01L 2224/81815* (2013.01); *H01L 2224/82365* (2013.01); *H01L 2224/92125* (2013.01); *H01L 2924/181* (2013.01); *H01L 2924/35* (2013.01); *H01L 2924/37001* (2013.01)

(58) Field of Classification Search
USPC ................. 257/737, 738, E23.068, E23.023; 438/613
See application file for complete search history.

(56) References Cited

U.S. PATENT DOCUMENTS

| | | | |
|---|---|---|---|
| 2004/0027788 A1* | 2/2004 | Chiu | H01L 21/563 361/329 |
| 2004/0155358 A1* | 8/2004 | Iijima | H01L 21/563 257/778 |
| 2008/0149369 A1 | 6/2008 | Kamamura et al. | |
| 2011/0309490 A1* | 12/2011 | Lu | H01L 23/293 257/737 |
| 2012/0222894 A1* | 9/2012 | Kaneko | H05K 3/244 174/257 |

* cited by examiner

SEMICONDUCTOR DEVICE INCLUDING SOLDER BRACING MATERIAL WITH A ROUGH SURFACE, AND MANUFACTURING METHOD THEREOF

CROSS-REFERENCE TO RELATED APPLICATIONS

This application is a divisional application of U.S. patent application Ser. No. 14/140,853 filed Dec. 26, 2013, which is incorporated herein by reference in its entirety.

FIELD

The disclosure relates to a semiconductor device and a method of manufacturing a semiconductor device.

BACKGROUND

Electronic equipment involving semiconductor devices are indispensable from our daily life. With the advancement of electronic technology, electronic equipments become more complicated and involve greater amount of integrated circuitry for executing the desired multi-functionality. Thus, manufacturing of the semiconductor device includes more and more steps of assembly and involves various kinds of materials with different physical properties. Therefore, there is a continuous demand on simplifying a manufacturing process and improving a structure of the semiconductor device.

During manufacturing operations of the semiconductor device, the semiconductor device is assembled and integrated with numbers of semiconductor components, and thus various kinds of materials with different physical and thermal properties have to be manipulated. As such, the integrated semiconductor components are in an undesired configuration after curing and reflowing of the semiconductor device. The undesired configuration would lead to a yield loss of the semiconductor device, poor performance of electrical connection, weak bondability between the components, development of cracks within the components, delamination of the components, etc. Furthermore, the undesired configuration of the components and the yield loss of the semiconductor device would further exacerbate materials wastage and increase the manufacturing cost.

As different semiconductor components and various kinds of materials with different properties are involved and a complexity of the manufacturing operations of the semiconductor device is increased, there are more challenges to improve the structural configuration of the semiconductor device and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
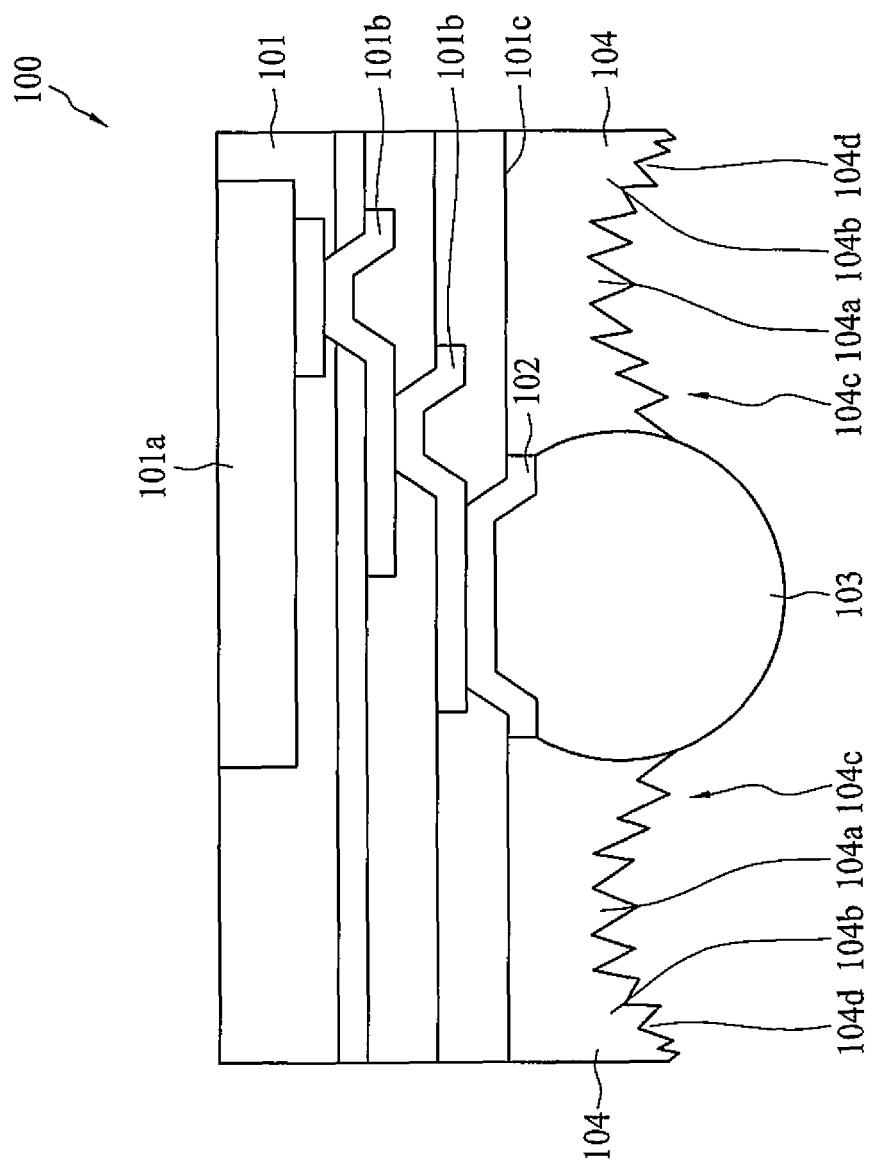
FIG. 1 is a schematic view of a semiconductor device in accordance with some embodiments of the present disclosure.

A semiconductor device is manufactured by a number of operations. During the manufacturing, several conductive bumps such as solder bumps, and solder balls, etc. are disposed on several bonding pads on a bottom surface of a substrate. The conductive bumps are then surrounded by a solder bracing material that partially expose and partially encapsulate the conductive bumps.

When the solder bracing material is cured, the cured solder bracing material provides protection for the conductive bumps from damages during subsequent manufacturing operations. The cured solder bracing material includes a surface that contacts to adhesive material such as an underfill in subsequent process. The conductive bumps bond with the bond pads on another substrate, and the underfill material fills a gap between the solder bracing material and the substrate. The surface of the solder bracing material is bonded with the underfill material.

However, the solder bracing material and the underfill material have different thermomechanical properties, and therefore the adhesion strength between them might gradually decrease in subsequent manufacturing operations. Also, cracks or stress concentration points would be developed between or within the solder bracing material and the underfill material. The cracks can even propagate through the solder bracing material or the underfill material during subsequent manufacturing operations to further weaken electrical connections between the substrates and cause delamination after thermal cycling, and ultimately result in a failure of the semiconductor device.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a semiconductor device with an improved configuration is disclosed. The semiconductor device includes a solder bracing material with a rough surface that contacts to an underfill material in subsequent operations. The rough surface of the solder bracing material provides more contact area for the underfill material bonding with the solder bracing material, and thus the adhesion strength between the solder bracing material and the underfill material is increased. The rough surface has sufficient surface roughness for preventing or even eliminating a delamination issue and a cracks development within the semiconductor device. The semiconductor device with the rough surface has improved reliability with respect to a pull test or a board level thermal cycling test. As such, a performance of the semiconductor device is improved.

FIG. 1 is an embodiment of a semiconductor device 100. The semiconductor device 100 includes a substrate 101. In some embodiments, the substrate 101 carries several circuits and supports several semiconductor components connected with the integrated circuits. In some embodiments, the substrate 101 is a circuit board including some circuits for electrical connection of components thereon. In some embodiments, the substrate 101 is a silicon wafer which would be fabricated to become integrated circuits (IC) in subsequent manufacturing operations. In some embodiments, the circuit board is a printed circuit board (PCB). In some embodiments, the substrate 101 is in a circular shape.

In some embodiments, the substrate 101 includes a die 101a. The die 101a is electrically connected with the circuits internal to the substrate 101. The die 101a connects to a redistribution layer (RDL) 101b within the substrate 101. The RDL 101b includes several conductive traces for electrically connecting the die 101a with a circuitry external to the substrate 101. In some embodiments, the RDL includes a conductive material such as gold, silver, copper, nickel, tungsten, aluminum, and/or alloys thereof.

In some embodiments, a pad 102 is disposed on a surface 101c of the substrate 101. The pad 102 is extended in parallel to the surface 101c. In some embodiments, the pad 102 is in a circular or elliptical shape from its top view. In some embodiments, the pad 102 is an under bump metallurgy (UBM) pad for receiving a conductive bump 103 such as solder bump, solder ball, solder paste or etc. The UBM pad is a solderable surface which is exposed for receiving the conductive bump 103 and electrically connecting with the circuitry internal to the substrate 101. The pad 102 is bonded with the conductive bump 103 after heat treatment such as reflow. In some embodiments, the pad 102 includes a conductive material such as gold, silver, copper, nickel, tungsten, aluminum, and/or alloys thereof.

In some embodiments, the conductive bump 103 is disposed on the pad 102. In some embodiments, the conductive bump 103 is disposed by ball drop, stencil printing, pasting, electroplating or etc. In some embodiments, the conductive bump 103 is configured for electrically connecting with a pad disposed on another substrate. In some embodiments, the conductive bump 103 is made of a solder material including copper, tin, aluminum, zinc, gold, lead or etc. In some embodiments, the conductive bump 103 is in a spherical shape as a solder ball.

In some embodiments, a solder bracing material 104 is disposed over the surface 101c and surrounds the conductive bump 103. In some embodiments, the solder bracing material 104 also surrounds a sidewall of the pad 102. In some embodiments, the solder bracing material 104 is configured for receiving an underfill material.

In some embodiments, the solder bracing material 104 includes liquid epoxy molding compounds, a dielectric film, a spin-on-dielectric material or etc. In some embodiments, the solder bracing material is disposed by molding, laminating, spinning on or etc.

In some embodiments, the solder bracing material 104 has a rough surface 104c including several protruded portions 104a and several recessed portions 104b. The protruded portions 104a and the recessed portions 104b are intervally disposed with each other. In some embodiments, the rough surface 104c is configured for receiving the underfill material. The rough surface 104c provides more contact area for bonding between the solder bracing material 104 and the underfill material. In some embodiments, the rough surface 104c is in a staggered configuration. In some embodiments, the rough surface 104c is a curved surface concaving towards the surface 101c of the substrate 101.

In some embodiments, the rough surface 104c has a line roughness (Ra) greater than about 1.3 µm. In some embodiments, the rough surface 104c has the line roughness (Ra) about 1 µm to about 3 µm. The line roughness (Ra) is measured by a line roughness measurement, which will be further discussed.

In some embodiments, the rough surface 104c is prepared by chemical treatment with a controlled temperature and time, such as chemical etching by a predetermined etchant under a predetermined temperature and a predetermined duration. In some embodiments, the rough surface 104c is achieved by peeling off a film such as a release film disposed on the partially cured solder bracing material 104.

In some embodiments, there are some gaps 104d on the rough surface 104c. The gaps 104d are disposed between the protruded portions 104a and the recessed portions 104b. In some embodiments, the gaps 104d of the rough surface 104c are configured for receiving the underfill material. The gaps 104d are filled with the underfill material when the conductive bump 103 is bonded with a pad of another substrate.

Figure 1A:
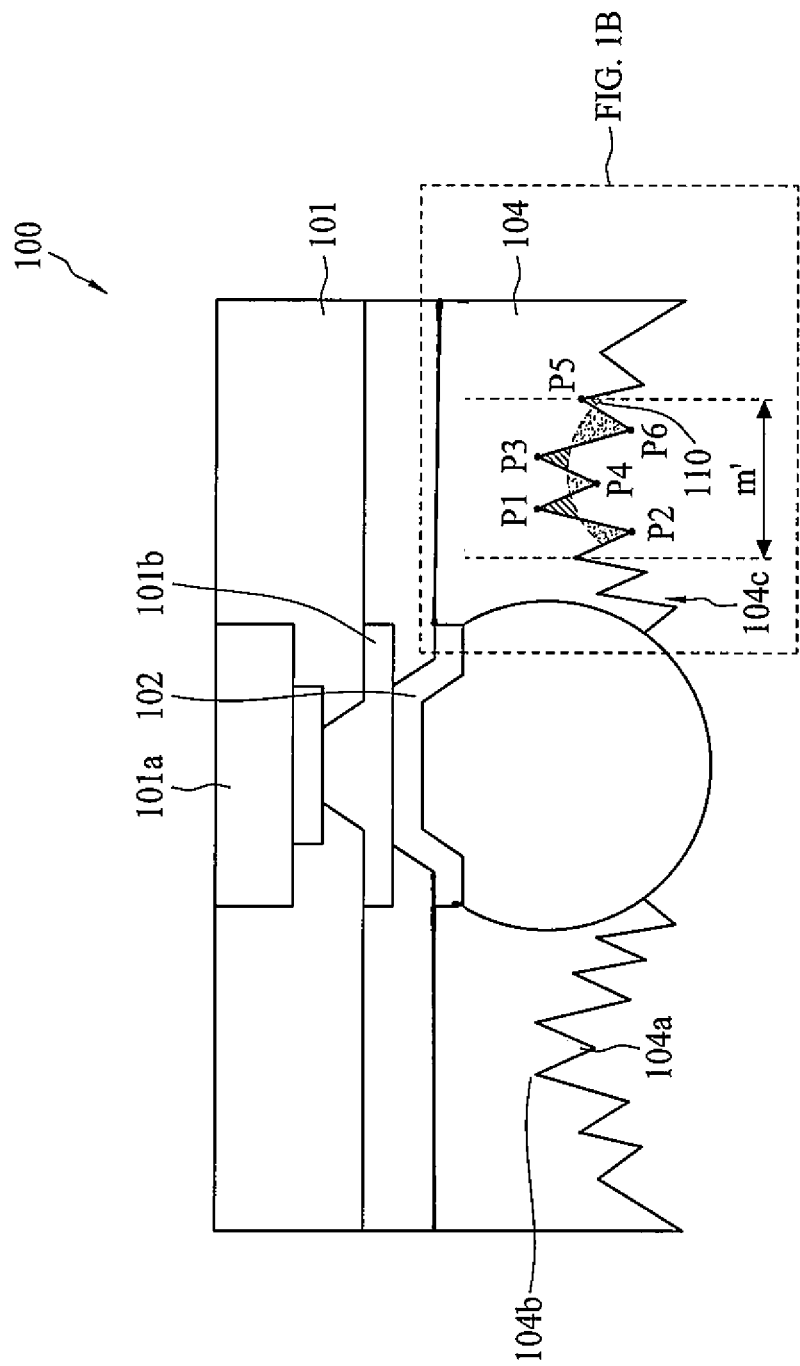
FIG. 1A is a schematic view of a semiconductor device with a reference line across a rough surface of a solder bracing material in accordance with some embodiments of the present disclosure.

A roughness of the rough surface 104c of the solder bracing material 104 is measured by various methods. In some embodiments, the roughness of the solder bracing material 104 is determined by a line roughness (Ra). The line roughness (Ra) is measured within a predetermined length of the rough interface 108. In some embodiments, the line roughness (Ra) of the rough surface 104c of the solder bracing material 104 is measured within a length m' as shown in FIG. 1A. In some embodiments, the length m' is about 400 µm. In some embodiments, the length m' is about 200 µm to about 600 µm. In some embodiments, the length m' is in a ratio to a size of the conductive bump 103 surrounded by the solder bracing material 104. In some embodiments, the length m' to the size of the conductive bump 103 is in a ratio of 1:3. In some embodiments, the ratio is about 1:1.5 to about 1:10.

Figure 1B:
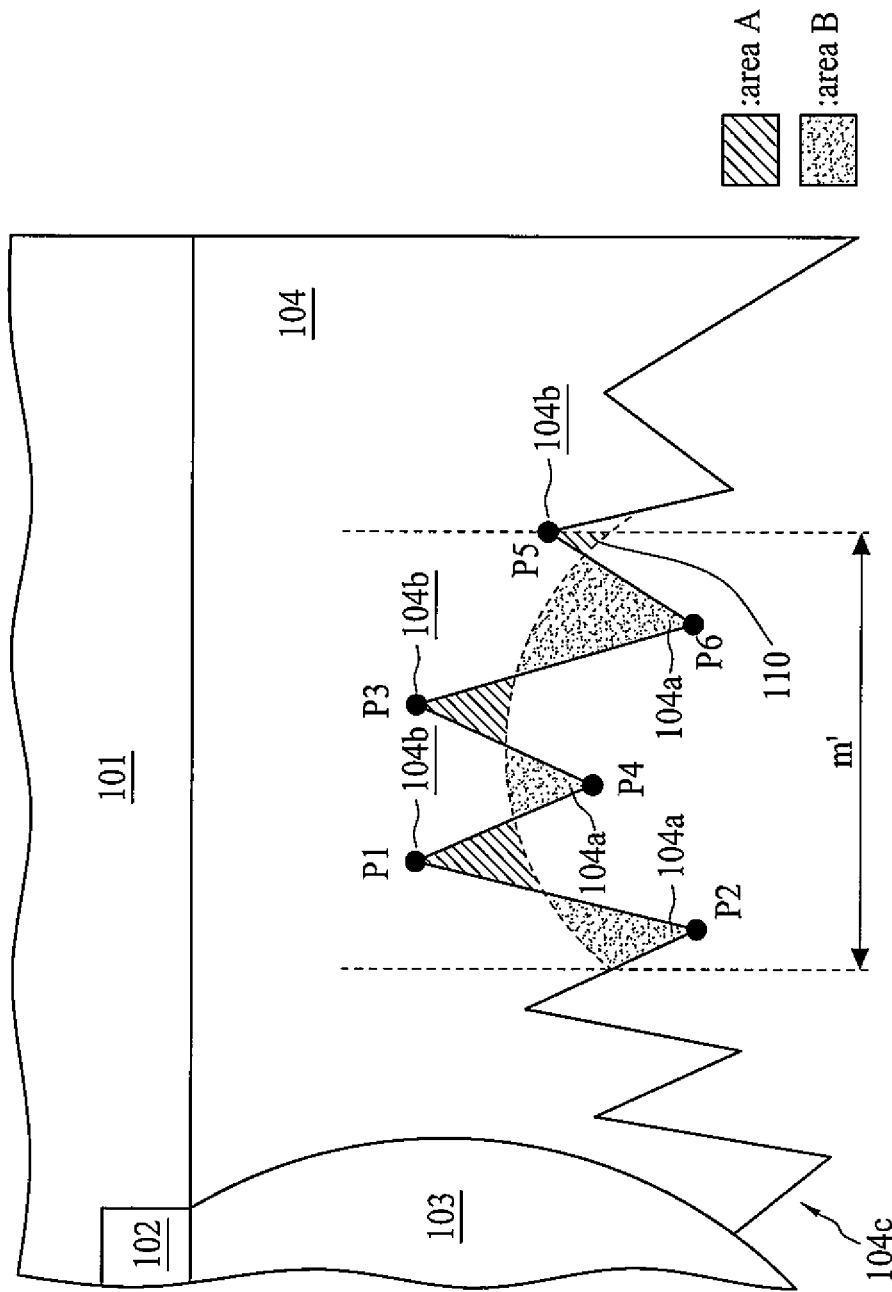
FIG. 1B is an enlarged view of a rough surface of a solder bracing material in accordance with some embodiments of the present disclosure.

FIG. 1B is en enlarged view of a part of the rough surface 104c of the solder bracing material 104. In some embodiments as shown in FIG. 1B, a reference line 110 is defined within the length m' for measuring the line roughness (Ra) of the rough surface 104c. In some embodiments, the reference line 110 is defined at a position where a sum of areas of the recessed portions 104b (area A) is substantially equal to a sum of areas of the protruded portions 104a (area B). In some embodiments, the reference line 110 is a curved line passing through the rough surface 104c.

After defining the reference line 110, several peak points on the rough surface 104c within the length m' are obtained. In some embodiments, the peak points are at peak positions of the protruded portions 104a of the rough surface 104c and at peak positions of the recessed portions 104b of the rough surface 104c. In some embodiments, the peak points (P1, P3, P5) are defined at the peak positions of the recessed portions 104b respectively, and the peak points (P2, P4, P6) are defined at the peak positions of the protruded portions 104a respectively.

After defining the peak points (P1, P2, P3, P4, P5, P6), vertical distances between the reference line 110 and the peak points (P1, P2, P3, P4, P5, P6) are obtained respectively. In some embodiments, the line roughness (Ra) of the rough surface 104c is an arithmetical mean of a sum of the vertical distances between the reference line 110 and the peak points (P1, P2, P3, P4, P5, P6).

In some embodiments, the line roughness (Ra) of the rough surface 104c within the length m' is greater than about 1.3 µm. In some embodiments, the line roughness (Ra) of the rough surface 104c is about 1 µm to 3 µm.

Figure 2A:
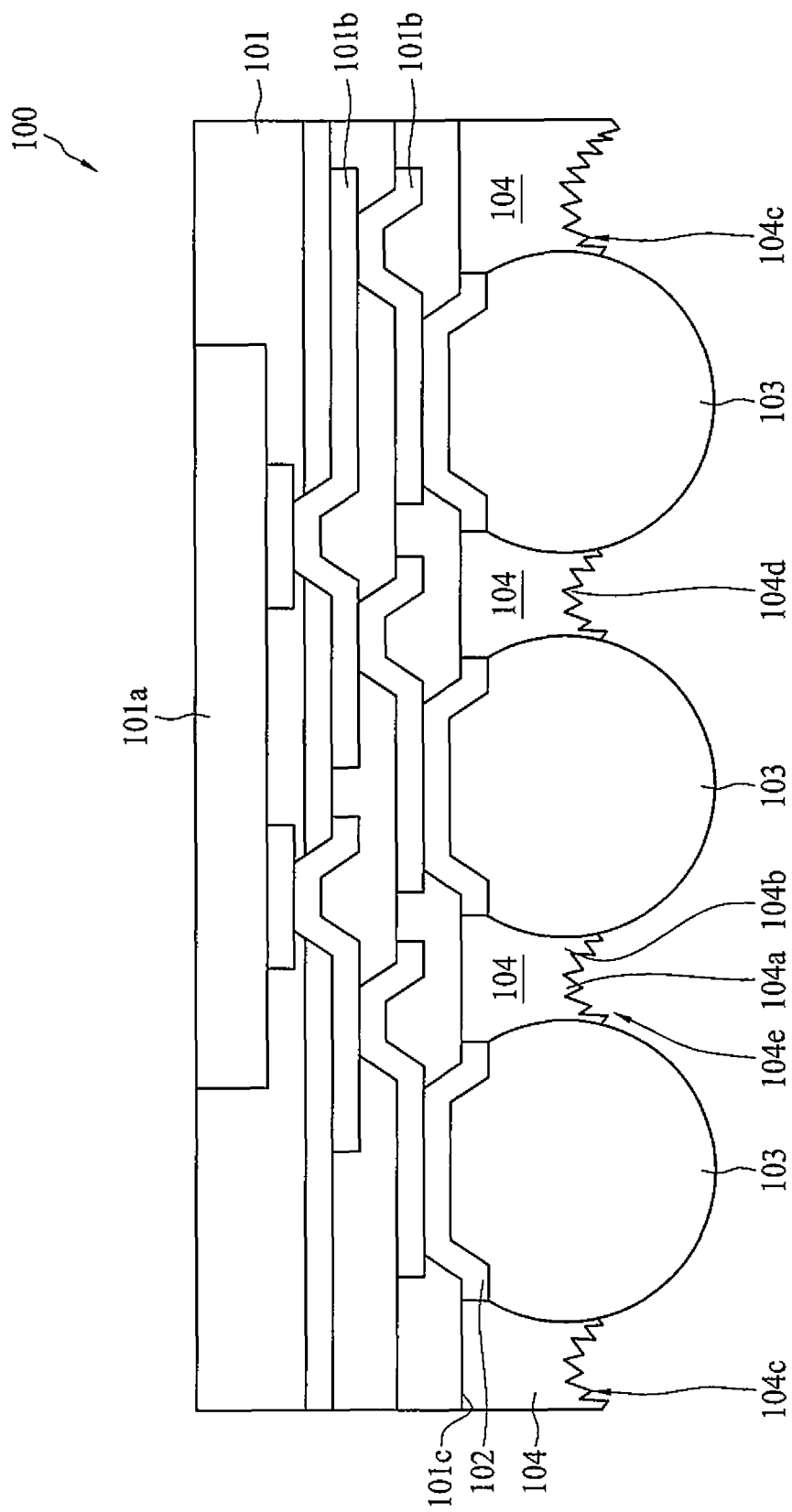
FIG. 2A is a schematic view of a semiconductor device with several conductive bumps in accordance with some embodiments of the present disclosure.

FIG. 2A is an embodiment of a semiconductor device 100. The semiconductor device 100 includes a substrate 101 and a die 101a within the substrate 101. In some embodiments, the substrate 101 is a die substrate. In some embodiments, the substrate 101 includes RDL 101b within the substrate 101. The RDL 101b connects the die 101a to several pads 102 disposed on the surface 101c of the substrate 101.

Figure 2B:
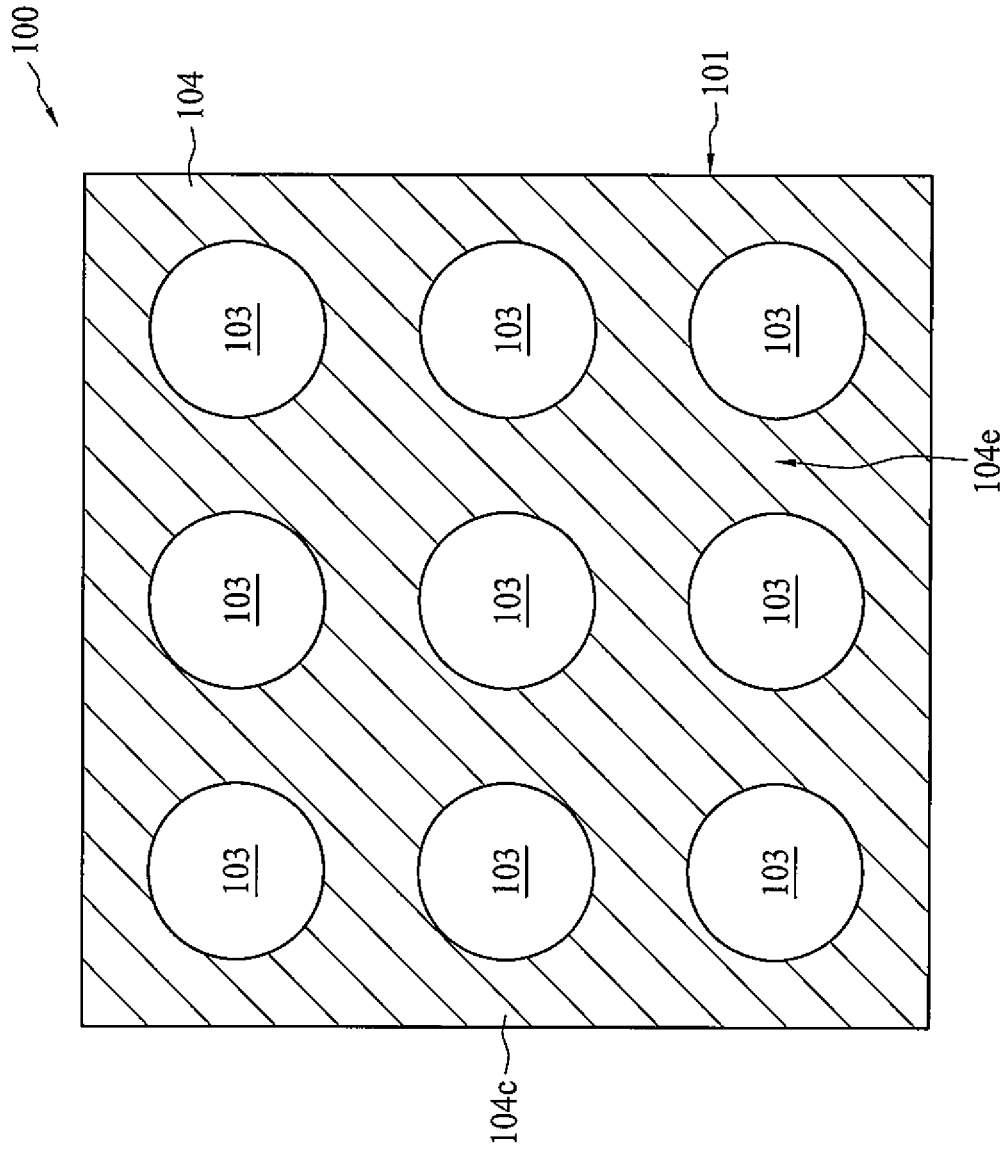
FIG. 2B is a schematic view of a semiconductor device with several conductive bumps arranged in a ball grid array in accordance with some embodiments of the present disclosure.

In some embodiments, several conductive bumps 103 are disposed on the pads 102 respectively. In some embodiments, the conductive bumps 103 are arranged in a ball grid array (BGA) as in FIG. 2B which is a bottom view of FIG. 2A. The conductive bumps 103 are disposed in several rows and several columns as the BGA or a matrix.

In some embodiments, the conductive bumps 103 are surrounded by a solder bracing material 104. The conductive bumps 103 are partially covered by the solder bracing material 104 and partially exposed for receiving the pads on another substrate. In some embodiments, the solder bracing material 104 is disposed between two adjacent conductive bumps 103. The solder bracing material 104 fills a spacing 104e between two adjacent conductive bumps 103.

In some embodiments as in FIG. 2A, the solder bracing material 104 has a rough surface 104c including several protruded portions 104a and several recessed portions 104b. The rough surface 104c is configured for receiving an underfill material. In some embodiments as in FIG. 2B, the rough surface 104c surrounds several conductive bumps 103 and is disposed on a bottom of the semiconductor device 100. The conductive bumps 103 are partially exposed from the solder bracing material 104 for electrically connecting with another substrate.

Figure 3:
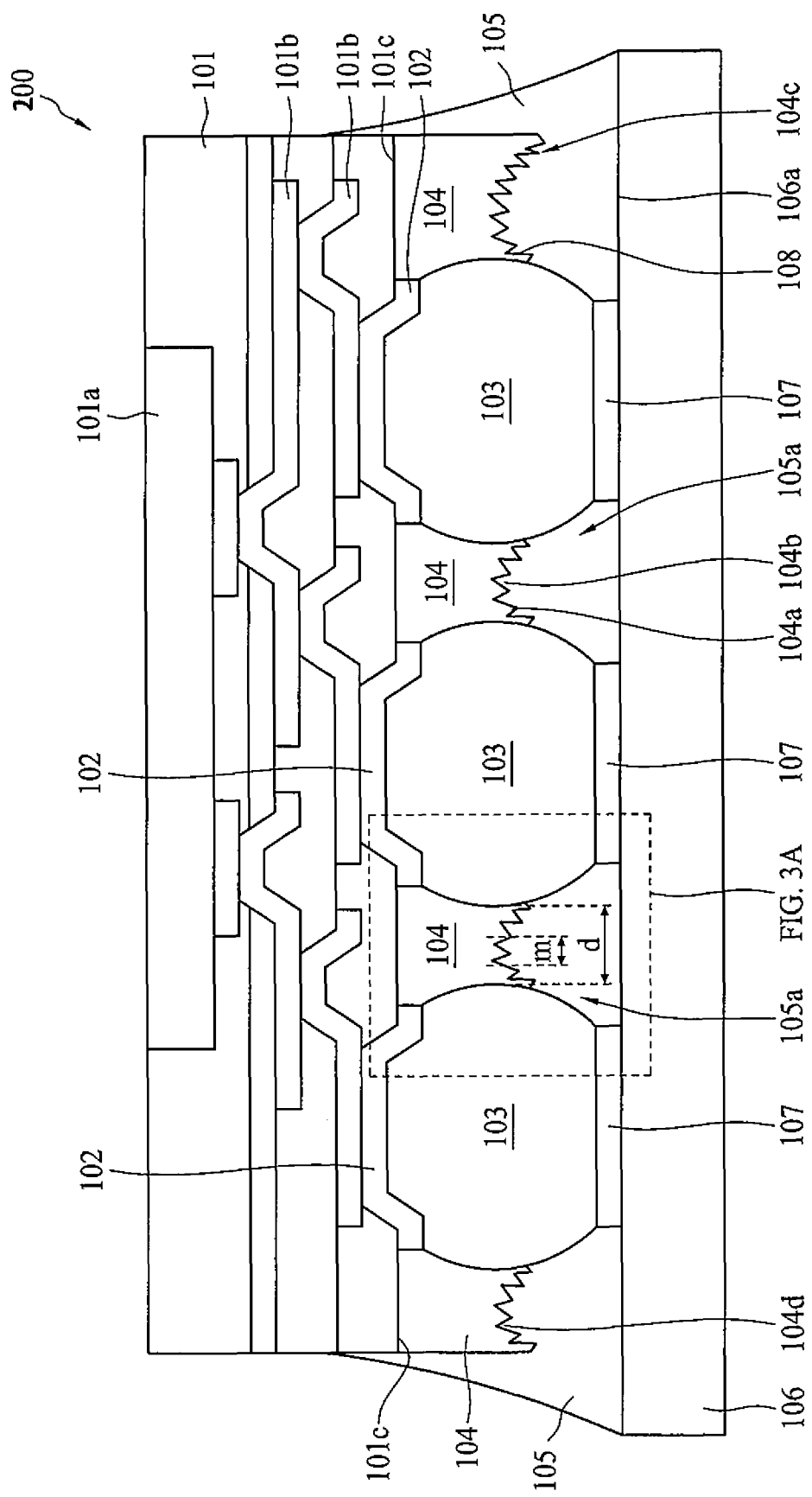
FIG. 3 is a schematic view of a semiconductor device with a first substrate and a second substrate in accordance with some embodiments of the present disclosure.

FIG. 3 is an embodiment of a semiconductor device 200. The semiconductor device 200 includes a substrate 101 and a die 101a within the substrate 101. In some embodiments, the substrate 101 is a die substrate. In some embodiments, the substrate 101 includes RDL 101b within the substrate 101. The RDL 101b connects the die 101a to several pads 102 disposed on the surface 101c of the substrate 101. In some embodiments, several conductive bumps 103 are disposed on the pads 102 respectively.

In some embodiments, the conductive bumps 103 are surrounded by a solder bracing material 104. In some embodiments, the solder bracing material 104 is disposed between two adjacent conductive bumps 103. The solder bracing material 104 has a rough surface 104c including several protruded portions 104a and several recessed portions 104b. The rough surface 104c is configured for receiving an underfill material 105.

In some embodiments, there is a substrate 106 configured for electrically connecting with the circuitry within the substrate 101. In some embodiments, the substrate 106 is a printed circuit board (PCB). The substrate 106 includes several bond pads 107 on a surface 106a of the substrate 106. The bond pads 107 are configured for receiving the conductive bumps 103 on the pads 102 correspondingly. The conductive bumps 103 are partially covered by the solder bracing material 104, while partially exposed for receiving respective bond pads 107 on the substrate 106. The conductive bumps 103 connect the pads 102 on the substrate 101 with the bond pads 107 on the substrate 106, such that the circuitry of the substrate 101 is electrically connected to the circuitry of the substrate 106.

In some embodiments, the underfill material 105 is disposed between the rough surface 104c of the solder bracing material 104 and surface 106a of the substrate 106. The underfill material 105 surrounds the conductive bumps 103 and fills a spacing 105a between two adjacent conductive bumps 103, such that the conductive bumps 103 are encapsulated by the solder bracing material 104 and the underfill material 105.

The underfill material 105 is an electrically insulated adhesive for securing a bonding between the substrate 101 and the substrate 106. In some embodiments, the underfill material 105 includes epoxy resin, epoxy molding compounds or etc.

In some embodiments, there is a rough interface 108 between the solder bracing material 104 and the underfill material 105. In some embodiments, the underfill material 105 fills the gaps 104d between the conductive bumps 103 to configure the rough interface 108. In some embodiments the rough interface 108 includes several protruded portions 104a and several recessed portions 104b. In some embodiments, the rough interface 108 is concaved towards the surface 101c of the substrate 101.

In some embodiments, the rough interface 108 includes a rough portion of the solder bracing material 104 and a rough portion of the underfill material 105 complement with the rough portion of the solder bracing material 104. The rough interface 108 bonds the solder bracing material 104 with the underfill material 105.

In some embodiments, a roughness of the rough interface 108 of the solder bracing material 104 is measured by various methods. In some embodiments, the roughness of the solder bracing material 104 is determined by a line roughness (Ra). The line roughness (Ra) is measured within a predetermined length of the rough interface 108. In some embodiments, the line roughness (Ra) of the rough interface 108 is measured within a length m. The length m presents a width of a half of a distance d at the center of the distance d, in which distance d presents the distance between the waist of two adjacent conductive bumps 103. In some embodiments, the distance d is measured from an outmost surface of one of the adjacent conductive bumps 103 to another outermost surface of another one of the adjacent conductive bumps 103. In some embodiments, the distance d is a shortest distance between the outmost surface of one of the adjacent conductive bumps 103 and the another outermost surface of another one of the adjacent conductive bumps 103.

Figure 3A:
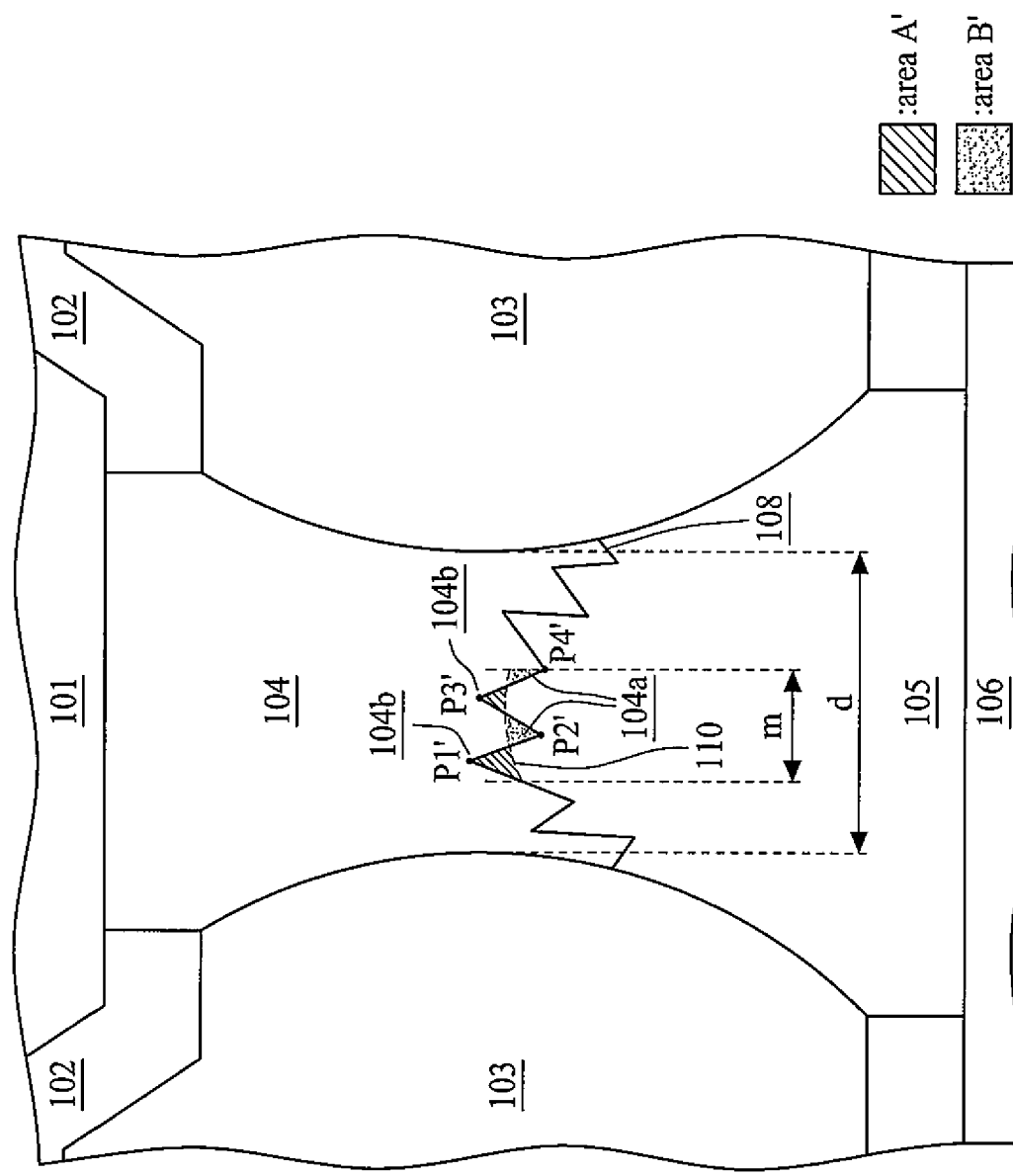
FIG. 3A is an enlarged view of a rough surface of a solder bracing material between two adjacent conductive bumps in accordance with some embodiments of the present disclosure.

FIG. 3A is en enlarged view of a part of the rough interface 108 of the solder bracing material 104 and the underfill material 105. In some embodiments as shown in FIG. 3A, a reference line 110 is defined within the length m for measuring the line roughness (Ra) of the rough interface 108. The length m is a half distance of the distance d. The distance d is a distance between outer surfaces of two adjacent conductive bumps 103. In some embodiments, the reference line 110 is defined at a position where a sum of areas of the recessed portions 104b (area A') is substantially equal to a sum of areas of the protruded portions 104a (area B'). In some embodiments, the reference line 110 is a curved line passing through the rough interface 108.

After defining the reference line 110, several peak points on the rough interface 108 within the length m are obtained. In some embodiments, the peak points are at peak positions of the protruded portions 104a of the rough interface 108 and at peak positions of the recessed portions 104b of the rough interface 108. In some embodiments, the peak points (P1', P3') are defined at the peak positions of the recessed portions 104b respectively, and the peak points (P2', P4') are defined at the peak positions of the protruded portions 104a respectively.

After defining the peak points (P1', P2', P3', P4'), vertical distances between the reference line 110 and the peak points (P1', P2', P3', P4') are obtained respectively. In some embodiments, the line roughness (Ra) of the rough interface 108 is an arithmetical mean of a sum of the vertical distances between the reference line 110 and the peak points (P1', P2', P3', P4').

In some embodiments, the line roughness (Ra) of the rough interface 108 within the length m is greater than about 1.3 µm. In some embodiments, the line roughness (Ra) of the rough interface 108 is about 1 µm to 3 µm.

In the present disclosure, a method of manufacturing a semiconductor device is also disclosed. In some embodiments, a semiconductor device is formed by a method. The method includes a number of operations and the description and illustration are not deemed as a limitation as the sequence of the operations.

Figure 4:
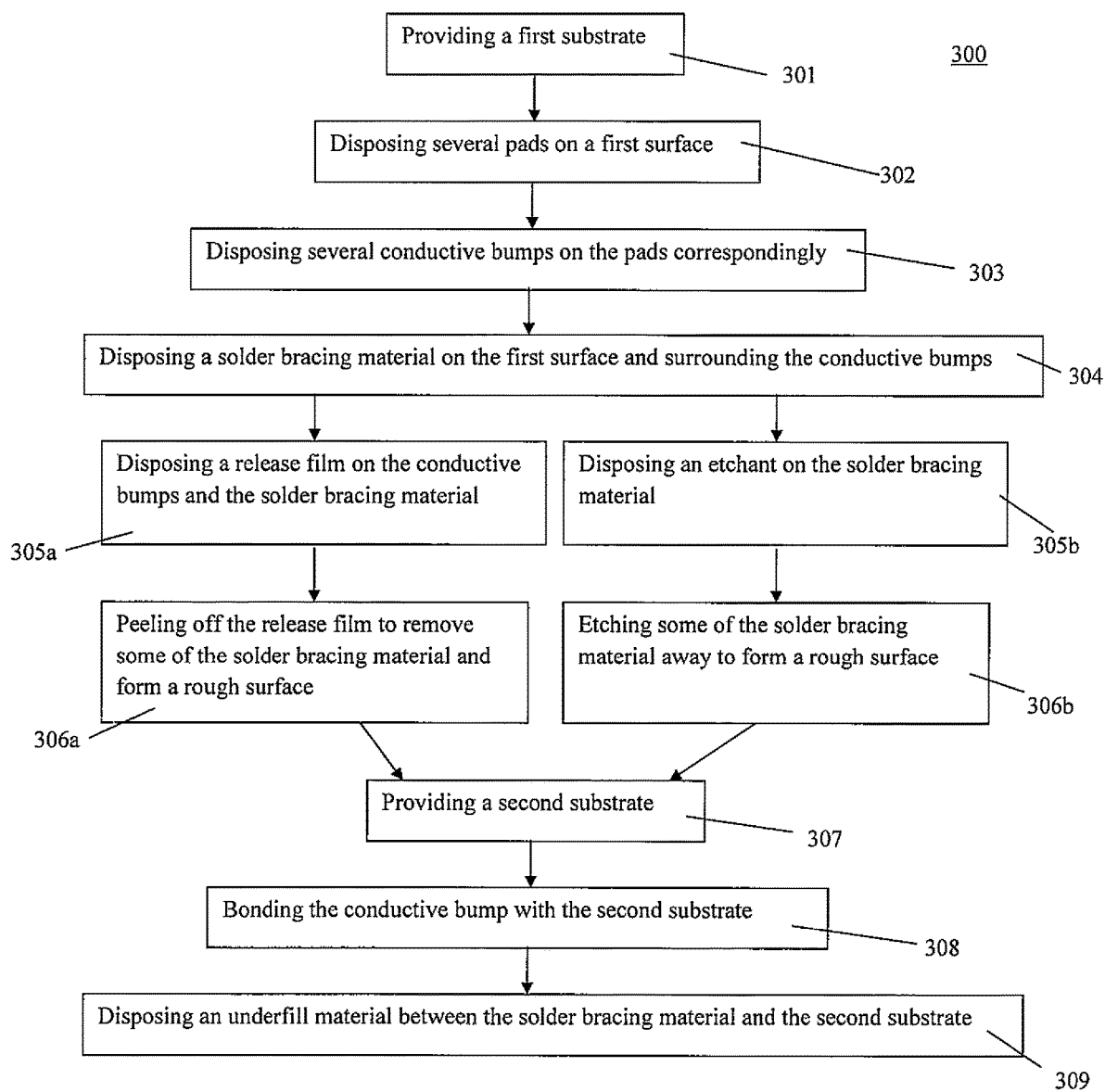
FIG. 4 is a flow diagram of a method of manufacturing a semiconductor device in accordance with some embodiments of the present disclosure.

FIG. 4 is an embodiment of a method 300 of manufacturing a semiconductor device. The method 300 includes a number of operations (301, 302, 303, 304, 305, 306, 307, 307, 308 and 309).

Figure 4A:
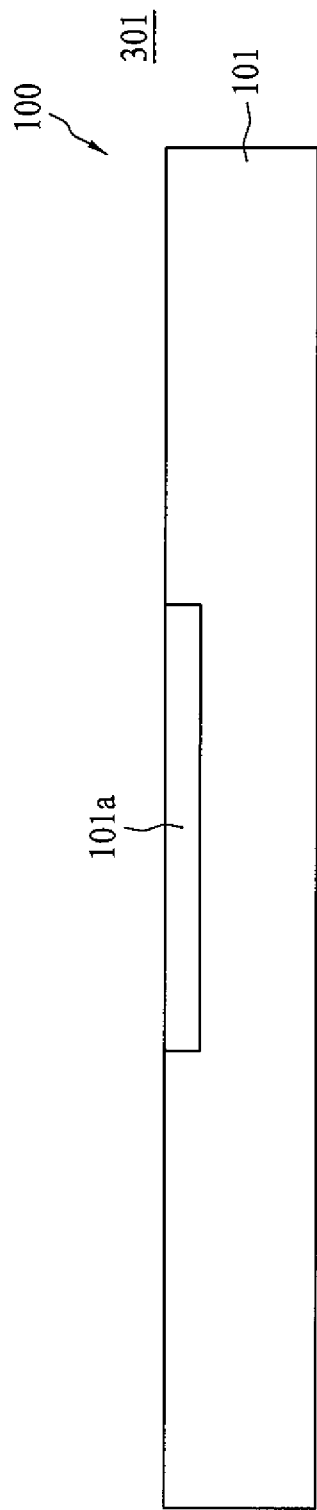
FIG. 4A is a schematic view of a semiconductor device with a first substrate in accordance with some embodiments of the present disclosure.

In operation 301, a first substrate 101 is provided as in FIG. 4A. In some embodiments, the first substrate 101 is a die substrate including at least one die 101a within the first substrate 101. In some embodiments, the first substrate 101 is configured for receiving another substrate and electrically connecting with another substrate. In some embodiments, the first substrate 101 includes silicon. In some embodiments, the first substrate 101 includes a circuitry within the first substrate 101. The circuitry includes several conductive traces within the first substrate 101 to connect several semiconductor components on the first substrate 101.

Figure 4B:
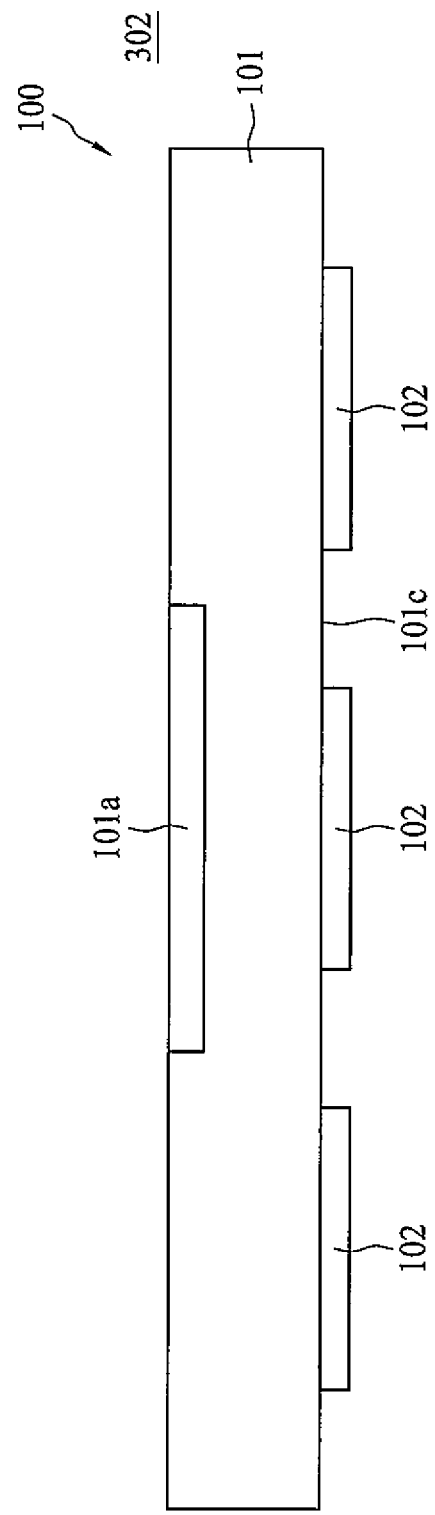
FIG. 4B is a schematic view of a semiconductor device with several pads on a first substrate in accordance with some embodiments of the present disclosure.

In operation 302, several pads 102 are disposed on a first surface 101c of the first substrate 101 as in FIG. 4B. The pads 102 are spaced apart from each other on the first surface 101c. In some embodiments, each of the pads 102 is configured for receiving a conductive bump for electrical connection between the first substrate 101 and another substrate.

Figure 4C:
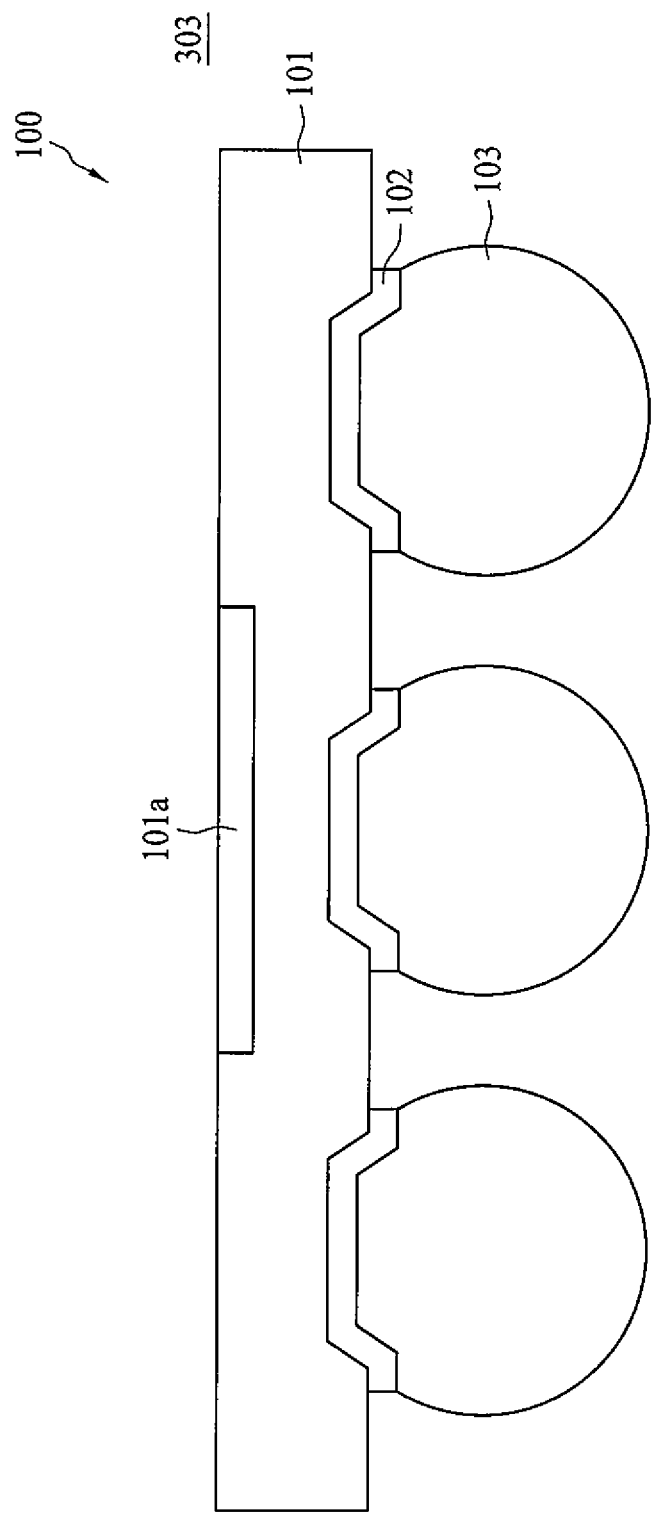
FIG. 4C is a schematic view of a semiconductor device with several conductive bumps on pads in accordance with some embodiments of the present disclosure.

In operation 303, several conductive bumps 103 are disposed on the pads 102 correspondingly as in FIG. 4C. The conductive bumps 103 are configured for bonding on a surface 102a of the respective pad 102. In some embodiments, the conductive bumps 103 are formed on the surface 102a by stencil, solder pasting, electroplating or etc. In some embodiments, each of the conductive bumps 103 is a solder ball or a solder paste or etc. In some embodiments, each conductive bump 103 is in a cylindrical, dome or spherical shape.

Figure 4D:
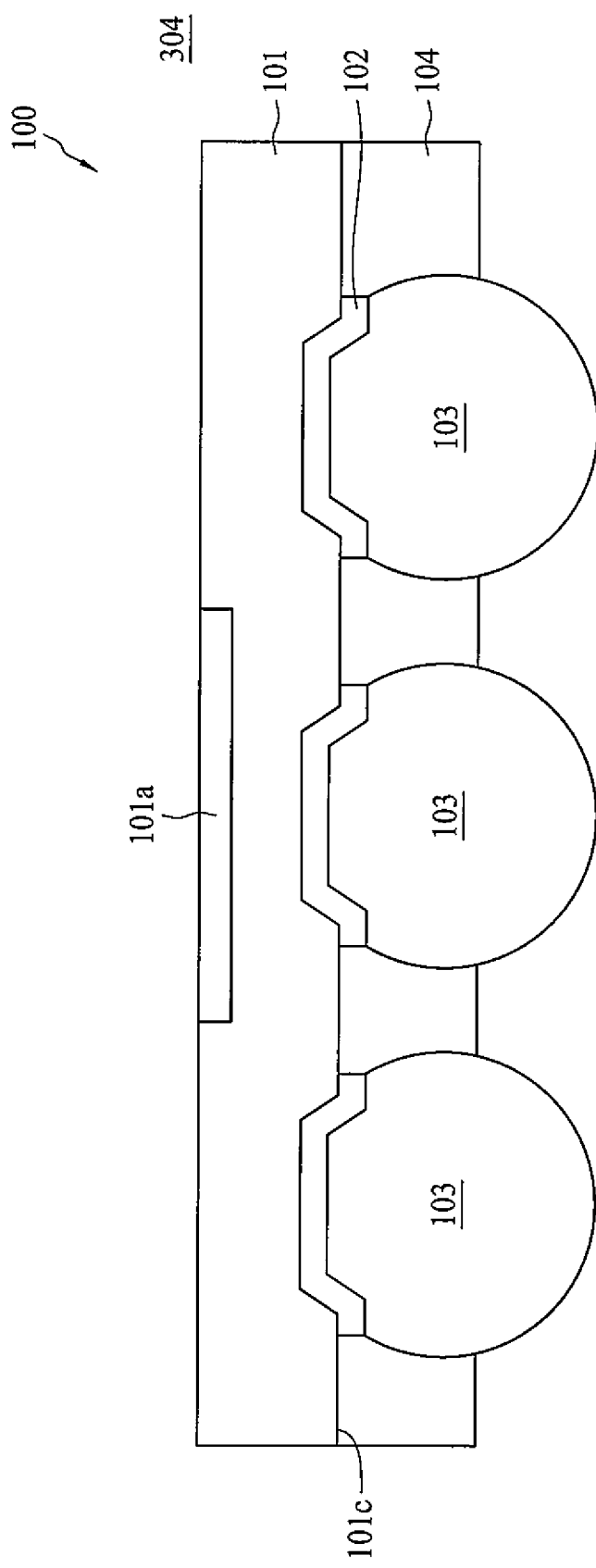
FIG. 4D is a schematic view of a semiconductor device with solder bracing material surrounding conductive bumps in accordance with some embodiments of the present disclosure.

In operation 304, a solder bracing material 104 is disposed on the first surface 101c and surrounds the conductive bumps 103 as in FIG. 4D. In some embodiments, the solder bracing material 104 is disposed between at least two adjacent conductive bumps 103. In some embodiments, the solder bracing material 104 is disposed by molding, laminating or spinning on.

In some embodiments, the solder bracing material 104 is disposed and fills a spacing between two adjacent conductive bumps 103 over the surface 101c, and then the solder bracing material 104 is cured by a heat treatment such as reflow, such that the solder bracing material 104 is formed on the surface 101c and the spacing between the conductive bumps 103. In some embodiments, the conductive bumps 103 are encapsulated by the solder bracing material 104. The conductive bumps 103 are partially exposed so as to bond with another substrate.

Figure 4E:
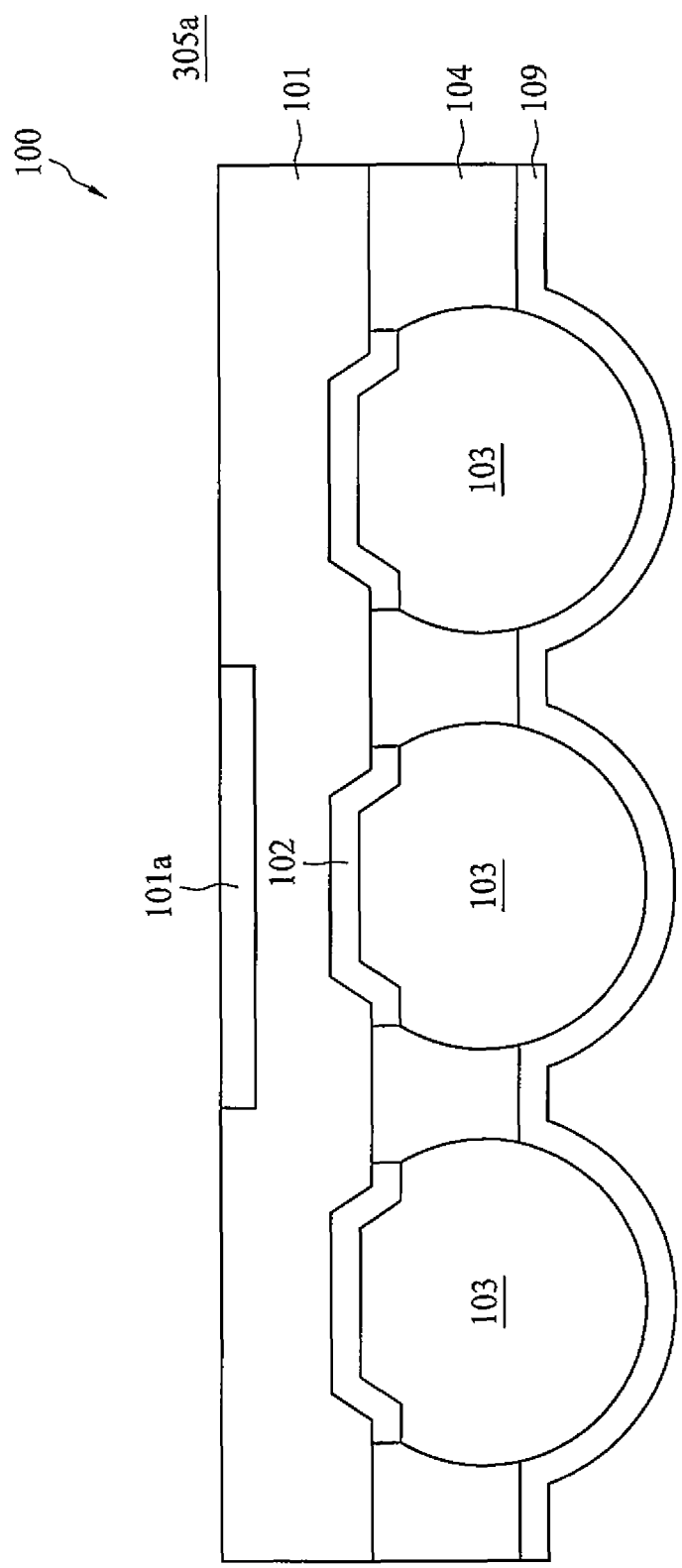
FIG. 4E is a schematic view of a semiconductor device with a release film disposed on a first substrate in accordance with some embodiments of the present disclosure.
Figure 4F:
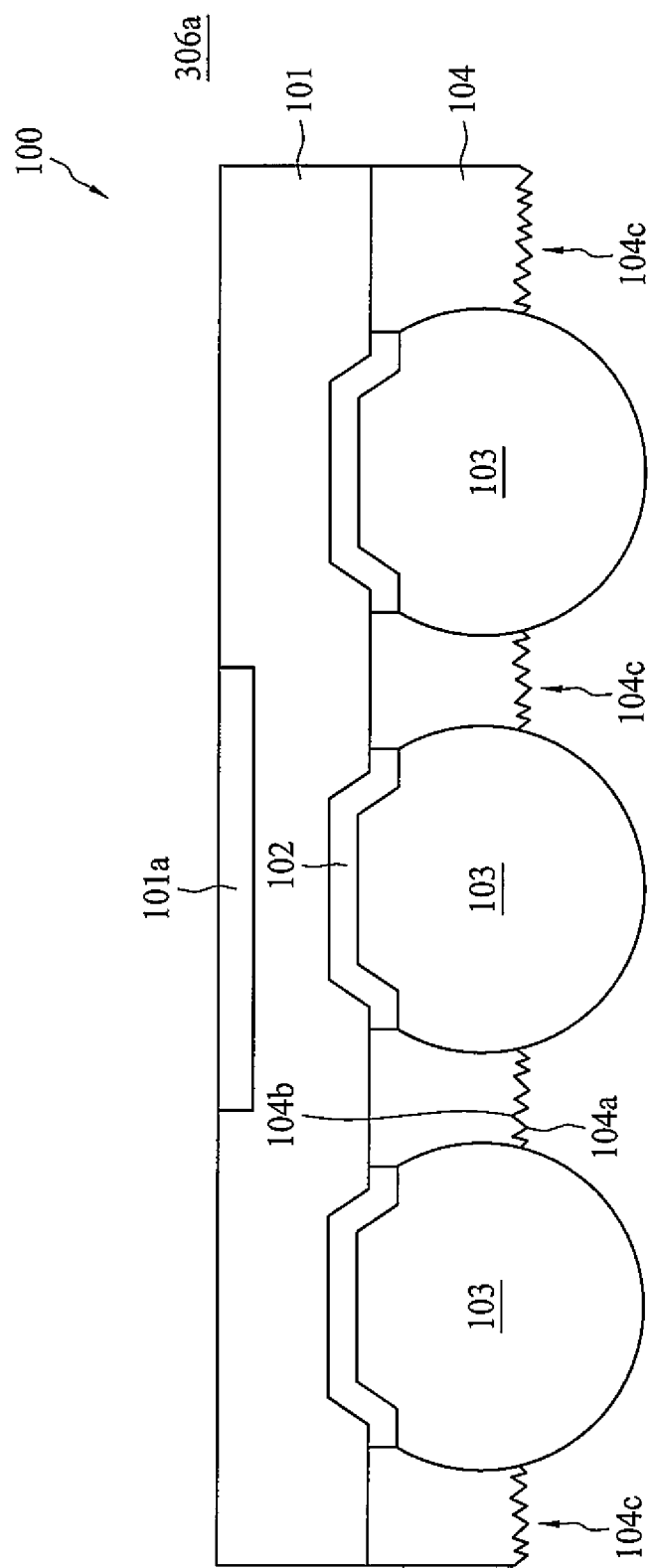
FIG. 4F is a schematic view of a semiconductor device with a solder bracing material of a rough surface in accordance with some embodiments of the present disclosure.

In some embodiments, a rough surface 104*c* of the solder bracing material 104 is formed by operations (305*a*, 306*a*) as in FIGS. 4E and 4F. In operation 305*a*, a release film 109 is disposed on the solder bracing material 104 and the conductive bumps 103 as in FIG. 4E. In some embodiments, the release film 109 is temporarily attached and covered the exposed part of the conductive bumps 103 and the solder bracing material 104. In some embodiments, the release film 109 is formed by molding or spinning on over the conductive bumps 103 and the solder bracing material 104. The release film 109 is then cured by reflow or other heat treatment. In some embodiments, the release film 109 includes an adhesive material such as epoxy resin.

In operation 306*a*, the release film 109 is removed to form a rough surface 104*c* as in FIG. 4F. In some embodiments, the release film 109 is peeled off from the solder bracing material 104 when the solder bracing material 104 is partially cured, so as to remove some of the solder bracing material 104, and thus the rough surface 104*c* is formed.

In some embodiments, the release film 109 is removed after the release film 109 is disposed on the conductive bumps 103 and the solder bracing material 104 over a predetermined period of time and under a predetermined temperature, so that the rough surface 104*c* including several protruded portions 104*a* and several recessed portions 104*b* is formed. In some embodiments, the rough surface 104*c* has sufficient line roughness (Ra) for receiving an underfill material in a subsequent operation.

Figure 4G:
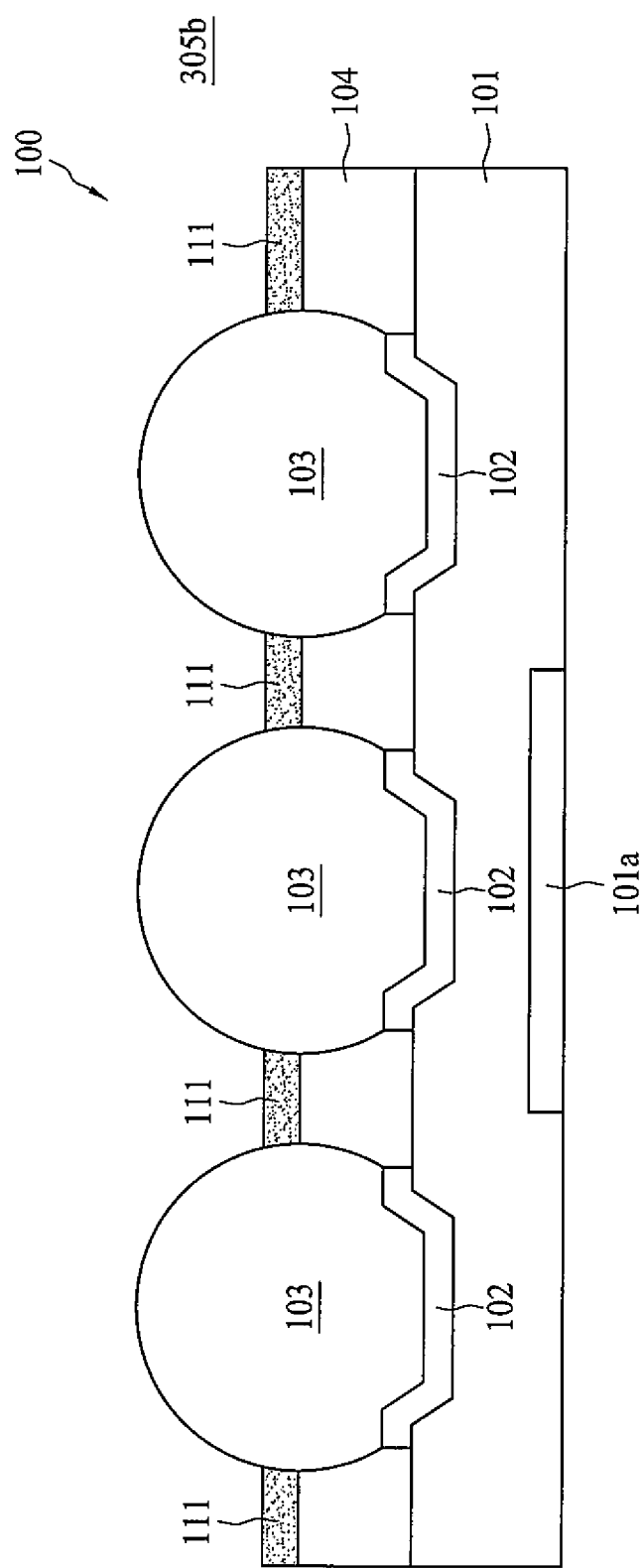
FIG. 4G is a schematic view of a semiconductor device with an etchant spraying on a solder bracing material in accordance with some embodiments of the present disclosure.
Figure 4H:
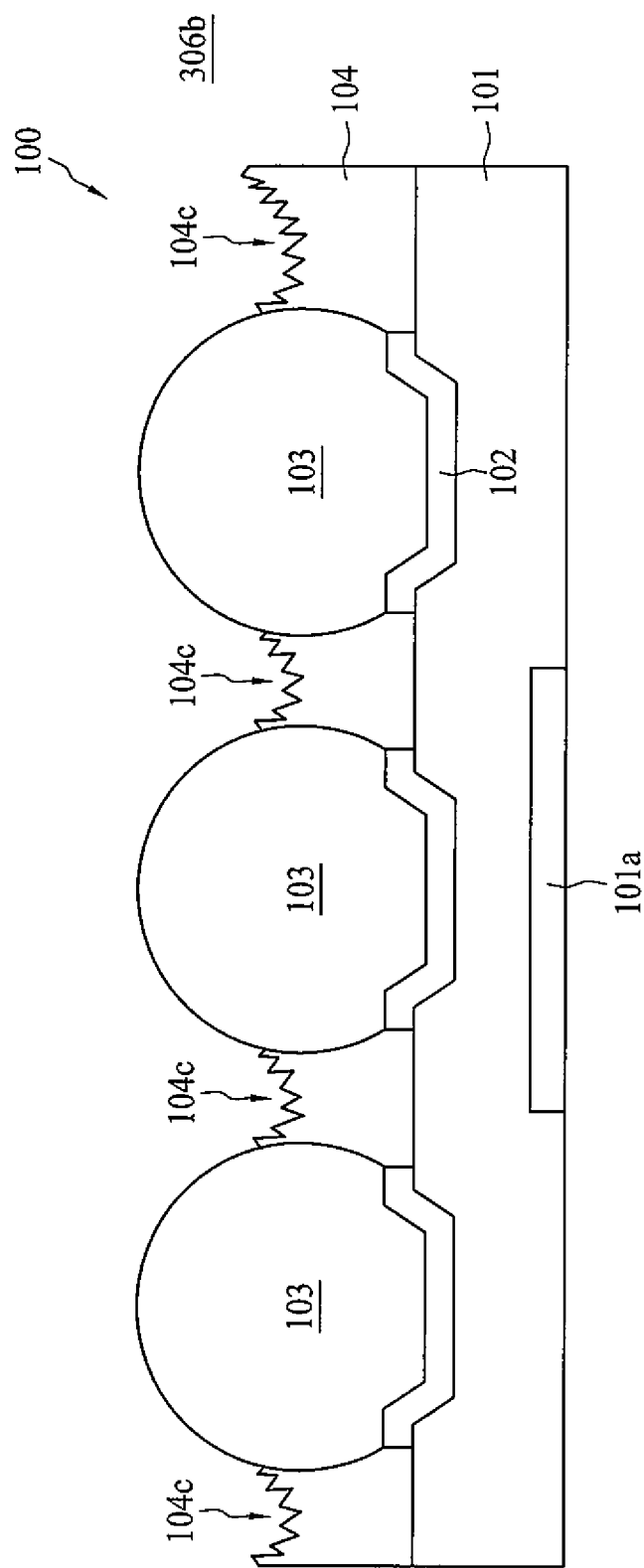
FIG. 4H is a schematic view of a semiconductor device with a solder bracing material of a rough surface in accordance with some embodiments of the present disclosure.

In some embodiments, the rough surface 104*c* of the solder bracing material 104 is formed by operations (305*b*, 306*b*) as in FIGS. 4G and 4H. In some embodiments, the rough surface 104*c* is formed by etching. In operation 305*b*, an etchant 111 is disposed on the solder bracing material 104 as in FIG. 4G. In some embodiments, the semiconductor device 100 is flipped over prior to the etching. The conductive bumps 103 are faced upward as in FIG. 4G. In some embodiments, the etchant 111 is disposed on the solder bracing material 104 by spraying after the flipping of the semiconductor device 100. The etchant 111 is spread over the solder bracing material 104. In some embodiments, the etchant 111 is selectively sprayed on the solder bracing material.

In operation 306*b*, the rough surface 104*c* is formed by etching away some of the solder bracing material 104 by the etchant 111 as in FIG. 4H. In some embodiments, the etchant 111 is disposed on the solder bracing material 104 under a predetermined temperature and a predetermined period of time, such that the etchant 111 removes and etches some of the solder bracing material 104 to form the rough surface 104*c* of the solder bracing material 104. In some embodiments, the rough surface 104*c* including several protruded portions 104*a* and several recessed portions 104*b* is formed over a predetermined duration and under a predetermined temperature, so that the rough surface 104*c* has sufficient line roughness (Ra) for receiving an underfill material in a subsequent operation. In some embodiments, the semiconductor device 100 is flipped over so that the conductive bumps are faced downward for subsequent operations after the etching.

Figure 4I:
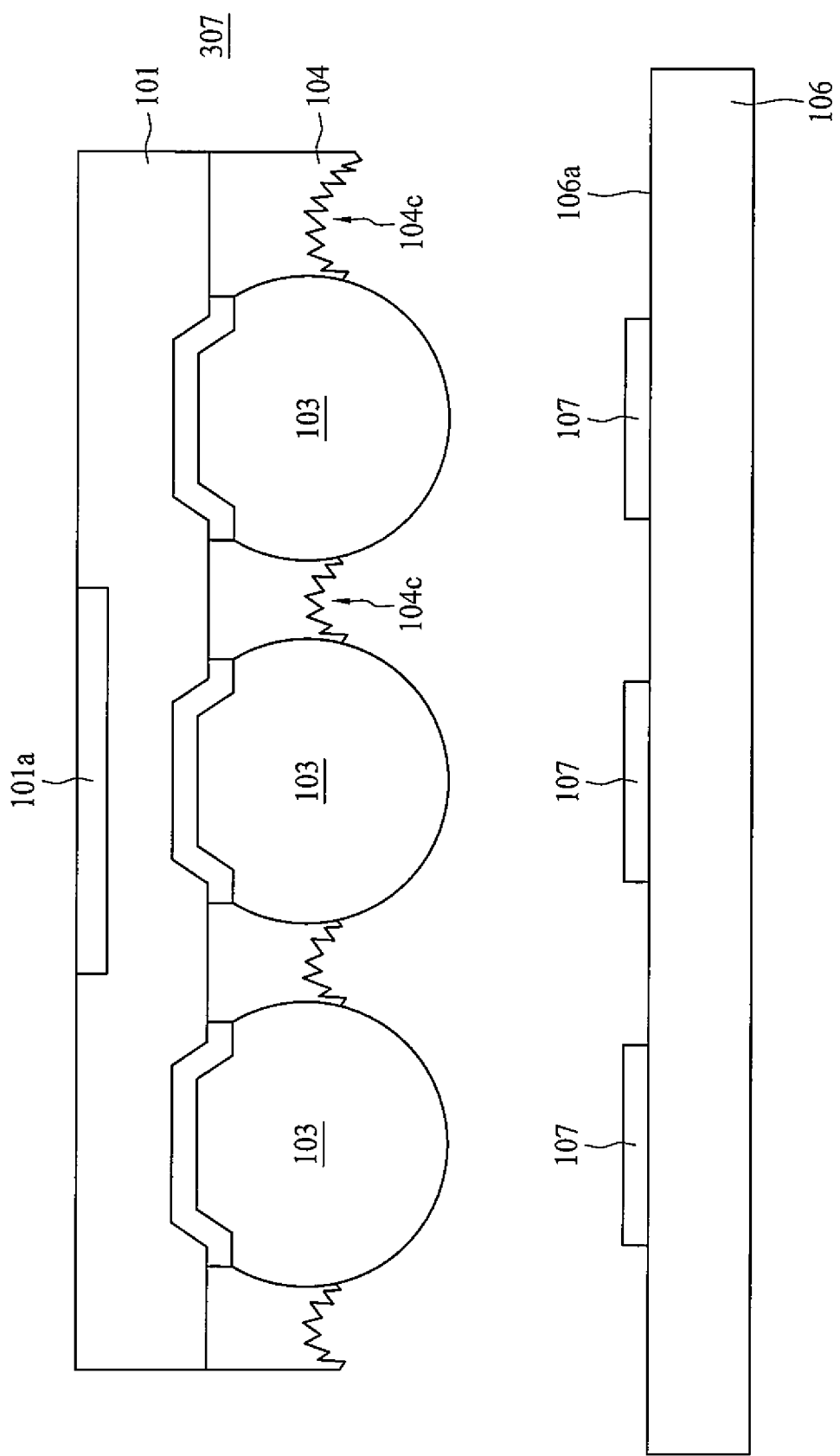
FIG. 4I is a schematic view of a semiconductor device and a second substrate in accordance with some embodiments of the present disclosure.

In operation 307, a second substrate 106 is provided as in FIG. 4I. In some embodiments, the second substrate 106 is a PCB including a circuitry within the second substrate 106. In some embodiments, the second substrate 106 is configured for electrically connecting the circuitry of the second substrate 106 with the circuitry of the first substrate 101. In some embodiments, the second substrate 106 is in a strip form. In some embodiments, the second substrate 106 includes ceramic, copper or etc.

In some embodiments, several bond pads 107 are disposed on the second substrate 106. In some embodiments, the bond pads 107 are extended along a surface 106*a* of the second substrate 106. In some embodiments, the bond pads 107 are configured for receiving the conductive bumps 103 on the first substrate 101 respectively.

Figure 4J:
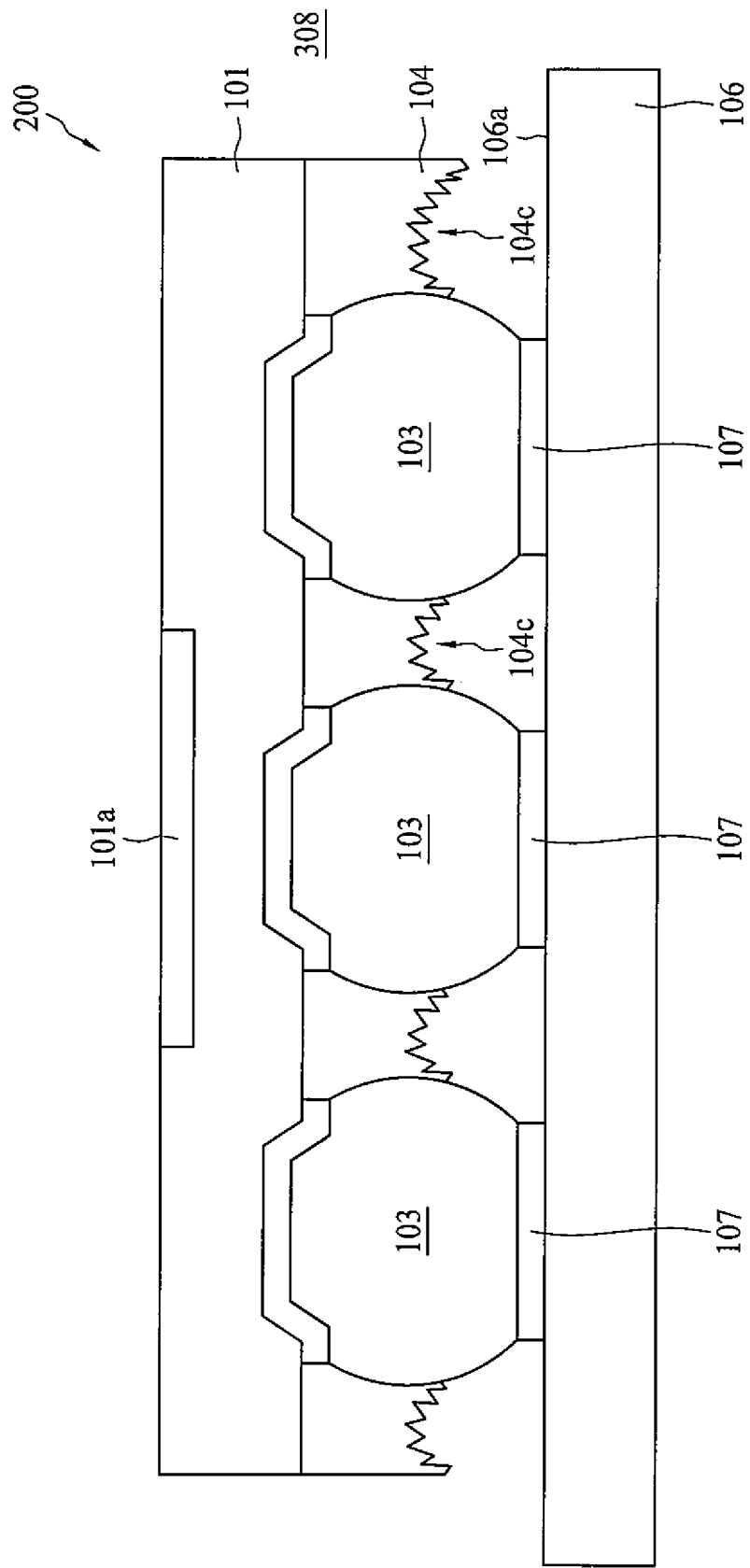
FIG. 4J is a schematic view of a semiconductor device having pads of a first substrate bonded with pads of a second substrate in accordance with some embodiments of the present disclosure.

In operation 308, the conductive bumps 103 on the first substrate 101 are bonded with the bond pads 107 of the second substrate 106 correspondingly as in FIG. 4J. In some embodiments, the conductive bumps 103 are attached on the bond pads 107 to electrically connect the circuitry within the first substrate 101 and the second substrate 106. The pads 102 of the first substrate 101 and the bond pads 107 of the second substrate 106 are bonded by the conductive bumps 103.

In some embodiments, the conductive bumps 103 are formed as solder bumps or solder balls when the pads 102 of the first substrate 101 are bonded with the bond pads 107 of the second substrate 106. In some embodiments, the conductive bumps 103 are in spherical shape. In some embodiments, the conductive bumps 103 are disposed between the pads 102 and the bond pads 107 by solder pasting.

Figure 4K:
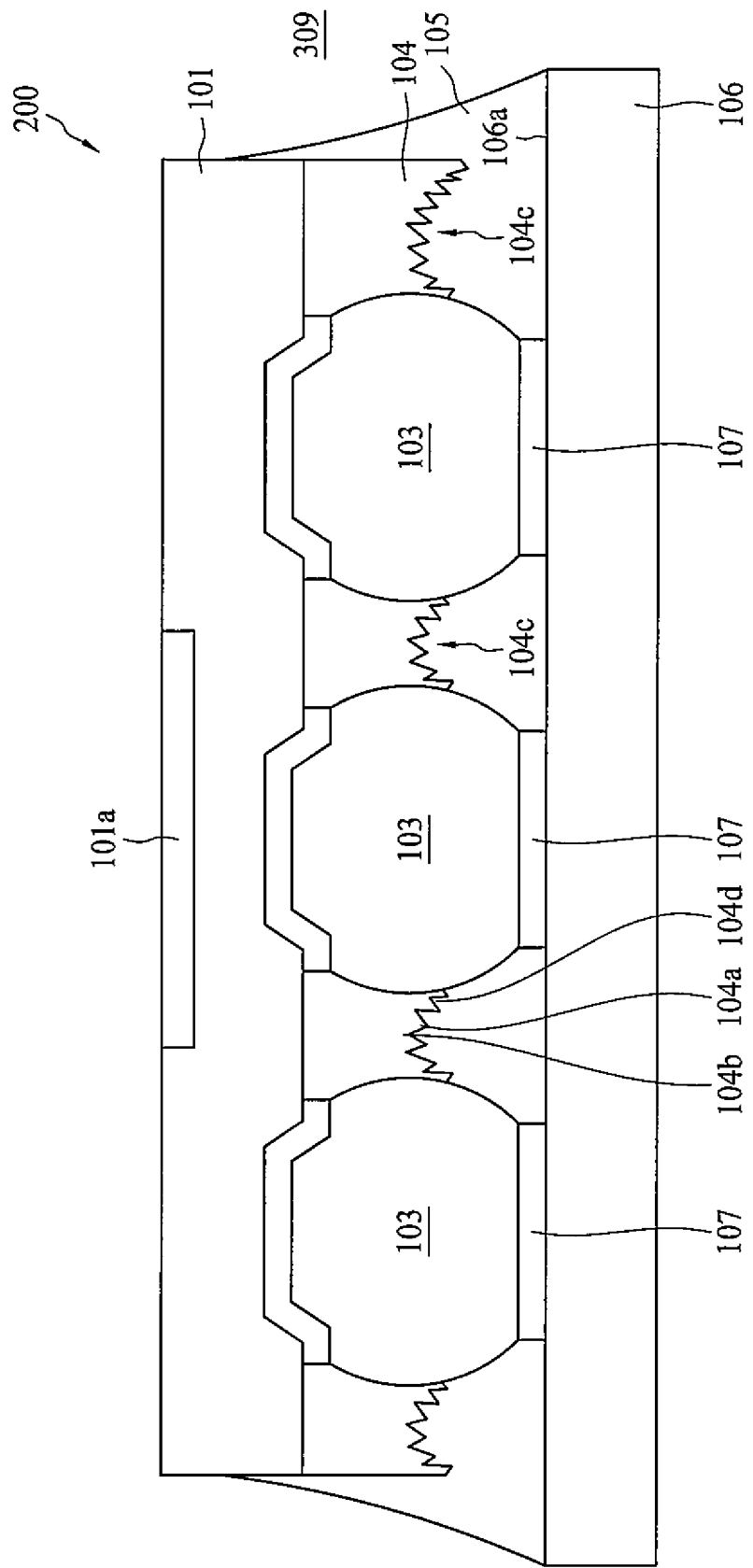
FIG. 4K is a schematic view of a semiconductor device with an underfill material between a first substrate and a second substrate in accordance with some embodiments of the present disclosure.

In operation 309, an underfill material 105 is disposed between the solder bracing material 104 and the second substrate 106 as in FIG. 4K. In some embodiments, the underfill material 105 flows into and fills up several gaps 104*d* between the protruded portions 104*a* and the recessed portions 104*b* of the rough surface 104*c*, so that exposed parts of the conductive bumps 103 are surrounded by the underfill material 105. The conductive bumps 103 are ultimately encapsulated by the solder bracing material 104 and the underfill material 105.

In some embodiments, a bonding between the first substrate 101 and the second substrate 106 is facilitated by forming a rough interface 104*c* between the solder bracing material 104 and the underfill material 105 upon a disposition of the underfill material 105. In some embodiments, the rough interface 104*c* includes a rough portion of the solder bracing material 104 and a rough portion of the underfill material complement with the rough portion of the solder bracing material 104.

In some embodiments, the rough interface 104*c* provides some friction between the solder bracing material 104 and the underfill material 105, so as to facilitate the bonding between the first substrate 101 and the second substrate 106.

The rough interface 104*c* increases a strength of the bonding between the solder bracing material 104 and the underfill material 105 as well as the first substrate 101 and the second substrate 106. Thus, a reliability of a semiconductor device 200 is improved. The semiconductor device 200 including the rough interface 104*c* between the solder bracing material and the underfill material has minimized a development of cracks and delamination, and has an improved performance in a pull test, a board level thermal cycling test or etc.

In some embodiments, a method of manufacturing a semiconductor device includes providing a substrate, disposing a plurality of pads on a surface of the substrate, disposing a plurality of conductive bumps on the plurality of pads correspondingly, disposing a solder bracing material surrounding the plurality of the conductive bumps and over the surface of the substrate, and forming a rough surface of the solder bracing material including a plurality of protruded portions and a plurality of recessed portions.

In some embodiments, the rough surface with a line roughness (Ra) of greater than about 1.3 μm is formed. In some embodiments, the method further includes disposing a release film on the solder bracing material and the plurality of conductive bumps. In some embodiments, the method further includes removing a release film disposed on the solder bracing material and the plurality of conductive bumps when the solder bracing material is partially cured.

In some embodiments, the method further includes measuring a line roughness (Ra) of the rough surface in a width of a half of a distance between two adjacent conductive bumps. In some embodiments, the method further includes defining a reference line across the rough surface for measuring a line roughness (Ra) of the rough surface. In some embodiments, the method further includes measuring a line roughness (Ra) of the rough surface by contacting a plurality of points on the solder bracing material through a probe.

In some embodiments, the method further includes removing a plurality of portions of the solder bracing material between the plurality of the conductive bumps to form the rough surface. In some embodiments, the method further includes etching the solder bracing material under a predetermined temperature and a predetermined duration by a predetermined etchant to form the rough surface.

In some embodiments, a method of manufacturing a semiconductor device includes providing a substrate including a plurality of pads on a surface of the substrate, disposing a plurality of conductive bumps on the plurality of pads correspondingly, disposing a solder bracing material surrounding the plurality of the conductive bumps and over the surface of the substrate. In some embodiments, the solder bracing material has a rough surface, and a line roughness (Ra) of the rough surface is greater than about 1.3 μm.

In some embodiments, the method further includes disposing a release film on the solder bracing material, and removing the release film from the solder bracing material to form the rough surface. In some embodiments, the method further includes curing the release film before the removing of the release film. In some embodiments, the removing of the release film is performed by peeling off the release film when the solder bracing material is partially cured.

In some embodiments, the method further includes etching the solder bracing material under a predetermined temperature and a predetermined duration by a predetermined etchant to form the rough surface.

In some embodiments, the rough surface of the solder bracing material includes a plurality of peak points, and a connecting line of the plurality of peak points between a shortest distance between two outmost surfaces of two adjacent conductive bumps is concaved toward the substrate.

In some embodiments, a method of manufacturing a semiconductor device includes providing a first substrate, disposing a plurality of pads on a surface of the first substrate, disposing a plurality of conductive bumps on the plurality of pads correspondingly, disposing a solder bracing material surrounding the plurality of conductive bumps over the surface of the first substrate, bonding the first substrate to a second substrate by the plurality of conductive bumps, and disposing an underfill between the solder bracing material and the second substrate to form a rough interface between the solder bracing material ad the underfill.

In some embodiments, the solder bracing material has rough surface concaved toward the first substrate.

In some embodiments, the rough interface includes a plurality of peak points, and a connecting line of the plurality of peak points between a shortest distance between two outmost surfaces of two adjacent conductive bumps is concaved toward the first substrate.

In some embodiments, the solder bracing material has sidewalls perpendicular to the surface of the first substrate, and the underfill covers the sidewalls of the solder bracing material.

The methods and features of this invention have been sufficiently described in the above examples and descriptions. It should be understood that any modifications or changes without departing from the spirit of the invention are intended to be covered in the protection scope of the invention.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the invention.

What is claimed is:

1. A method of manufacturing a semiconductor device, comprising:
   providing a substrate;
   disposing a plurality of pads on a surface of the substrate;
   disposing a plurality of conductive bumps on the plurality of pads correspondingly;
   disposing a solder bracing material surrounding the plurality of the conductive bumps and over the surface of the substrate after the disposing of the plurality of conductive bumps, wherein the solder bracing material is in contact with a sidewall of each of the plurality of the pads and the plurality of conductive bumps;
   disposing an etchant on the solder bracing material;
   forming a concave rough surface of the solder bracing material by etching away some of the solder bracing material by the etchant, wherein the concave rough surface of the solder bracing material is concaved toward the substrate and includes a plurality of protruded portions and a plurality of recessed portions.

2. The method of claim 1, wherein the concave rough surface with a line roughness (Ra) of greater than about 1.3 μm is formed.

3. The method of claim 1, further comprising measuring a line roughness (Ra) of the concave rough surface in a width of a half of a distance between two adjacent conductive bumps.

4. The method of claim 1, further comprising defining a reference line across the concave rough surface for measuring a line roughness (Ra) of the concave rough surface.

5. The method of claim 1, further comprising measuring a line roughness (Ra) of the concave rough surface by contacting a plurality of points on the solder bracing material through a probe.

6. The method of claim 1, wherein the forming of the concave rough surface further comprises removing a plurality of portions of the solder bracing material between the plurality of the conductive bumps by the etchant.

7. The method of claim 1, further comprising etching the solder bracing material by the etchant under a predetermined temperature and a predetermined duration to form the concave rough surface.

8. The method of claim 1, wherein the concave rough surface of the solder bracing material comprises a plurality of peak points, and a connecting line of the plurality of peak points between a shortest distance between two outmost surfaces of two adjacent conductive bumps is concaved toward the substrate.

9. A method of manufacturing a semiconductor device, comprising:
provviding a substrate comprising a plurality of pads on a first surface of the substrate and a die disposed on a second surface of the substrate, wherein the second surface is opposite to the first surface, and the die is in direct contact with the substrate;
disposing a plurality of conductive bumps on the plurality of pads correspondingly;
disposing a solder bracing material surrounding the plurality of the conductive bumps and over the first surface of the substrate after the disposing of the plurality of conductive bumps, wherein the solder bracing material is in contact with the plurality of the pads and the plurality of conductive bumps;
disposing an etchant on the solder bracing material; and
forming a concave rough surface of the solder bracing material by etching away some of the solder bracing material by the etchant,
wherein a line roughness (Ra) of the concave rough surface of the solder bracing material is greater than about 1.3 μm and the concave rough surface of the solder bracing material is concaved toward the substrate.

10. The method of claim 9, wherein the forming of the concave rough surface comprises etching away the some of the solder bracing material under a predetermined temperature and a predetermined duration by the etchant.

11. The method of claim 9, wherein the concave rough surface of the solder bracing material comprises a plurality of peak points, and a connecting line of the plurality of peak points between a shortest distance between two outmost surfaces of two adjacent conductive bumps is concaved toward the substrate.

12. The method of claim 9, wherein the die includes a first surface facing the plurality of pads and a second surface opposite to the first surface, and the second surface of the die is aligned with the second surface of the substrate.

13. The method of claim 9, further comprising a redistribution layer (RDL) electrically connecting the die to at least one of the plurality of pads.

14. The method of claim 9, wherein the concave rough surface of the solder bracing material is in contact with the conductive bumps.

15. A method of manufacturing a semiconductor device, comprising:
providing a first substrate;
disposing a plurality of pads on a surface of the first substrate;
disposing a plurality of conductive bumps on the plurality of pads correspondingly;
disposing a solder bracing material surrounding the plurality of conductive bumps over the surface of the first substrate after the disposing of the plurality of conductive bumps, wherein the solder bracing material is in contact with the plurality of the pads and the plurality of conductive bumps;
bonding the first substrate to a second substrate by the plurality of conductive bumps; and
disposing an underfill between the solder bracing material and the second substrate to form a rough interface between the solder bracing material and the underfill,
wherein a line roughness (Ra) of the rough interface is greater than about 1.3 μm, the solder bracing material has a sidewall aligned with and coupled to a sidewall of the first substrate, the sidewall of the solder bracing material is perpendicular to the surface of the first substrate, and the underfill covers the sidewall of the solder bracing material and a portion of the sidewall of the first substrate.

16. The method of claim 15, wherein the solder bracing material comprises a rough surface concaved toward the first substrate.

17. The method of claim 15, wherein the rough interface comprises a plurality of peak points, and a connecting line of the plurality of peak points between a shortest distance between two outmost surfaces of two adjacent conductive bumps is concaved toward the first substrate.

18. The method of claim 16, further comprising removing portions of the solder bracing material to form the rough surface by an etchant.

19. The method of claim 18, further comprising:
disposing the etchant on the solder bracing material; and
removing the portions of the solder bracing material under a predetermined temperature and a predetermined duration to form the rough surface.

20. The method of claim 15, wherein the rough interface is in contact with the conductive bump.

* * * * *